(12) United States Patent
Zebermann et al.

(10) Patent No.: US 6,241,561 B1
(45) Date of Patent: Jun. 5, 2001

(54) TERMINAL BLOCK ARRANGEMENT FOR AN ELECTRICAL SYSTEM

(75) Inventors: Christoph Zebermann, Beverungen; Michael Schnatwinkel, Herford, both of (DE)

(73) Assignee: Weidmuller Interface GmbH & Co., Detmold (DE)

( * ) Notice: Subject to any disclaimer, the term of this patent is extended or adjusted under 35 U.S.C. 154(b) by 0 days.

(21) Appl. No.: 09/489,965

(22) Filed: Jan. 24, 2000

(30) Foreign Application Priority Data

Jan. 25, 1999 (DE) .......................... 299 01 194 U

(51) Int. Cl.⁷ .................................................. H01R 9/26
(52) U.S. Cl. ............................................ 439/716; 439/928
(58) Field of Search ................................ 439/709, 715, 439/716, 928, 631

(56) References Cited

U.S. PATENT DOCUMENTS

| | | | |
|---|---|---|---|
| 3,172,014 | * 3/1965 | Johnson | 439/716 |
| 4,401,351 | 8/1983 | Record . | |
| 4,477,862 | * 10/1984 | Gonzales | 361/393 |
| 5,071,356 | 12/1991 | Strate et al. . | |
| 5,318,461 | 6/1994 | Frikkee et al. . | |
| 5,411,417 | 5/1995 | Horn et al. . | |
| 5,588,881 | 12/1996 | Eggert et al. . | |

FOREIGN PATENT DOCUMENTS

| | | |
|---|---|---|
| 36 08 752 C1 | 5/1987 | (DE) . |
| 44 38 801 C1 | 1/1996 | (DE) . |
| 196 10 559 A1 | 9/1997 | (DE) . |
| 297 13 960 U1 | 12/1997 | (DE) . |
| 297 13 960 U1 | 1/1998 | (DE) . |
| 196 51 962 A1 | 6/1998 | (DE) . |
| 197 18 996 C1 | 6/1998 | (DE) . |
| 197 10 768 A1 | 9/1998 | (DE) . |
| 0 364 618 A1 | 4/1990 | (EP) . |
| 0 661 915 A1 | 7/1995 | (EP) . |
| 0 709 932 B1 | 12/1999 | (EP) . |

\* cited by examiner

Primary Examiner—Brian Sircus
Assistant Examiner—Javaid Nasri
(74) Attorney, Agent, or Firm—Laubscher & Laubscher

(57) ABSTRACT

An internal bus connector device is provided for use in the terminal block of an electrical power and signal distribution system, wherein the connector device includes a thin support plate that extends parallel with the support rail of the system and that carries a plurality of rows of pins each of which includes a pair of orthogonally arranged portions that extend parallel with and normal to the support plate, respectively. The pin portions that extend normal to the support plate are adapted for connection with the circuits of an associated printed circuit board, and the pin portions that extend parallel with the support plate are connected with conductors on the terminal block or with corresponding terminals of an adjacent terminal block mounted on the same support rail.

6 Claims, 6 Drawing Sheets

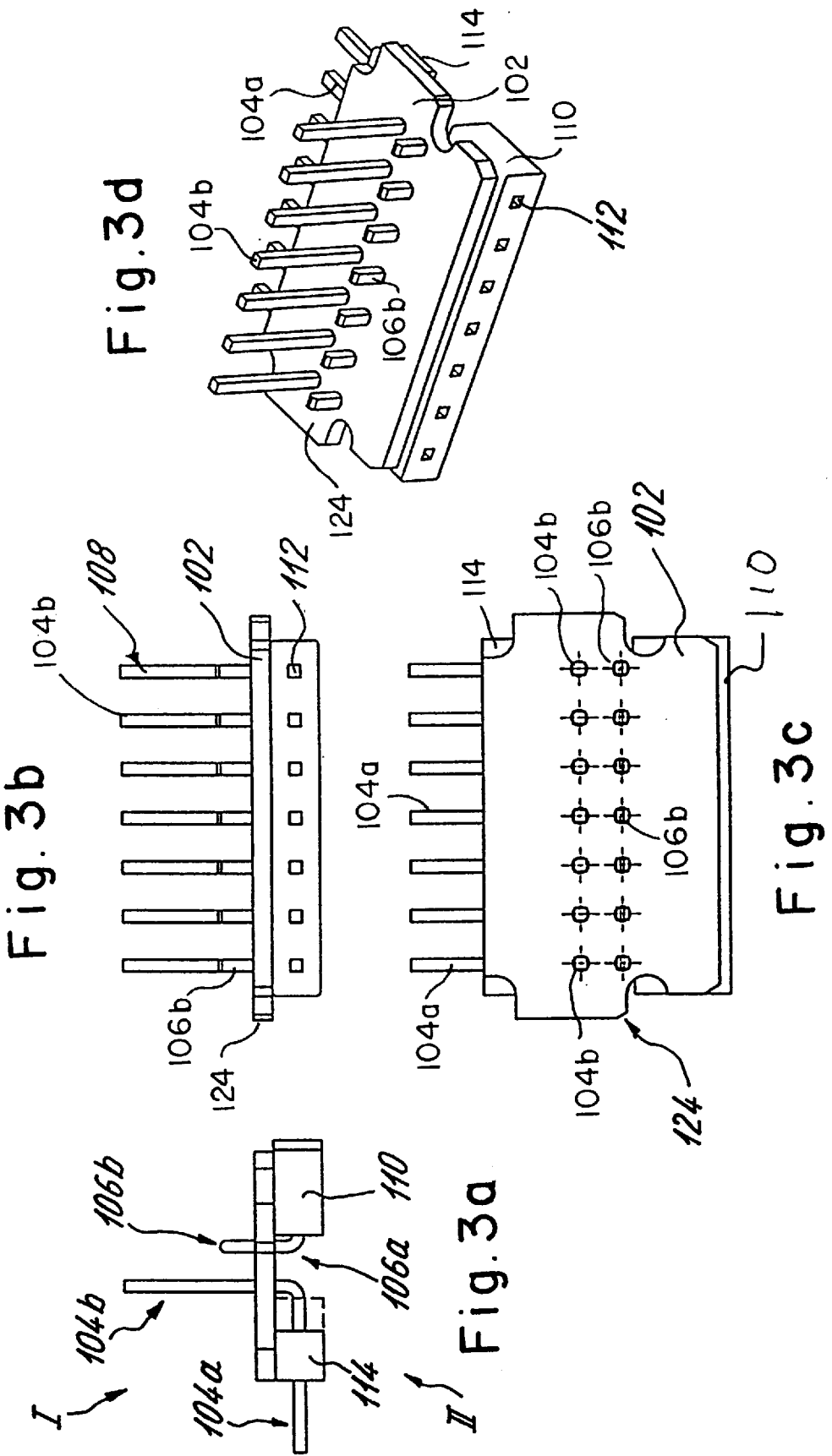

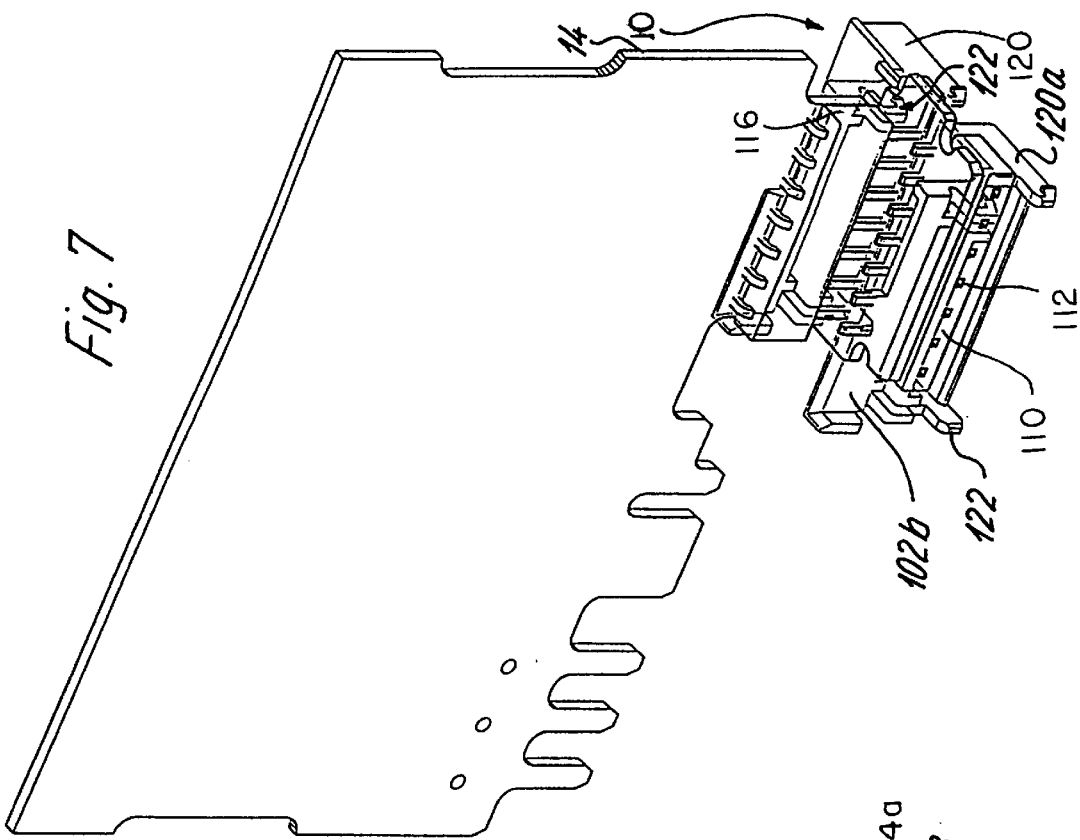
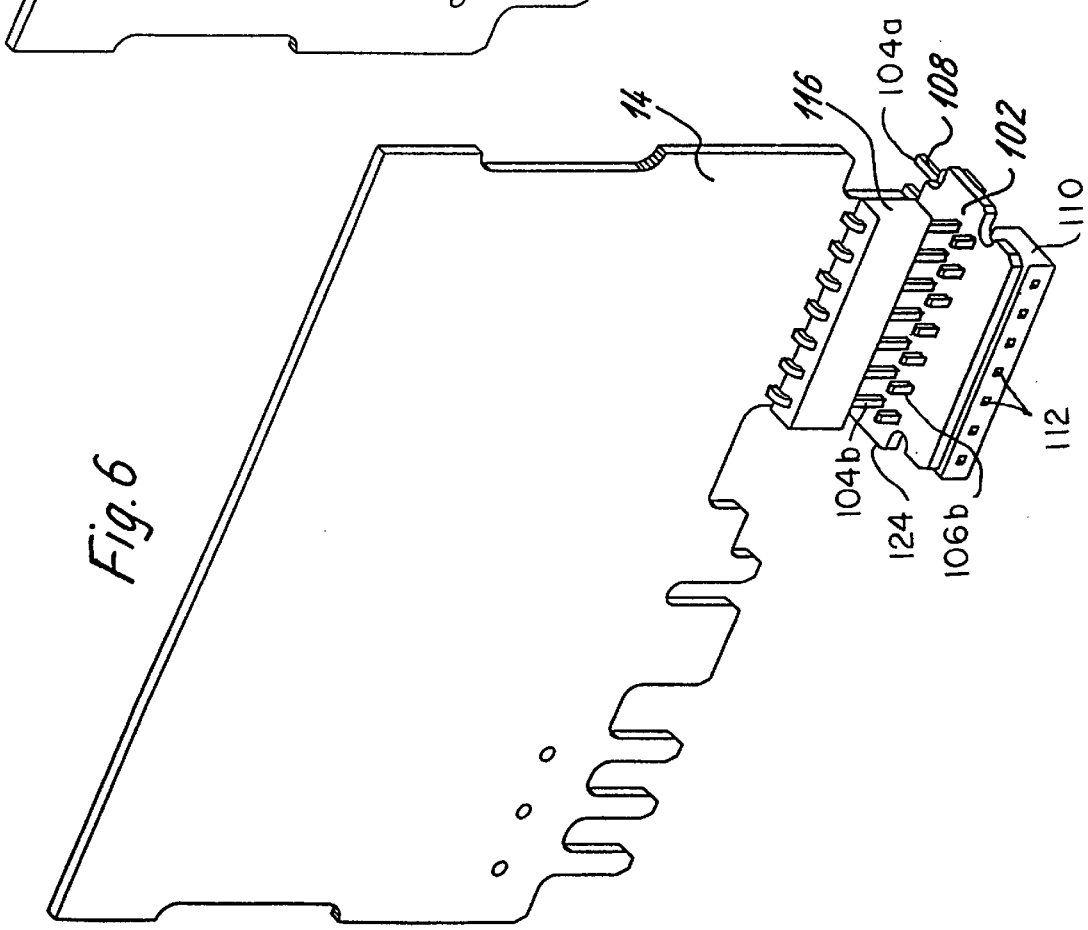

TERMINAL BLOCK ARRANGEMENT FOR AN ELECTRICAL SYSTEM

BACKGROUND OF THE INVENTION

1. Field of the Invention

A terminal block for an electrical power and signal distribution system is disclosed including internal bus connector means that are removably supported on the terminal block for connecting the conductors of the distribution system with the circuits of a printed circuit board removably mounted on the terminal block, and/or with the various terminals of an adjacent terminal block. The terminal blocks are mounted on a common support rail, and the internal bus conductor means of each terminal block are mounted orthoganally of the terminal block and parallel with the support rail.

2. Brief Description of the Prior Art

A typical bus conductor section for an electrical appliance is known from European Patent Application No. EP 95 113 729 A2 (now European Patent No. 709,932). In the appliance shown in this patent, where the internal bus conductor section is made as a continuous thin plate with strip conductors applied thereupon, terminal blocks that can be lined up on support rails are used for the purpose of signal adaptation between a superordinate field bus and initiators, field units or the like that are connected to the terminal blocks. The terminal blocks are assembled as connection or module blocks with different functions; here, we distinguish between protective conductor discs, feed-in discs, supply/signal conductor discs and notch foot discs. One or several terminal blocks can be connected via the internal bus conductor with a connecting module for the field bus.

The internal bus conductor section of this solution entails the following problem: In case of a randomly long lineup of module discs and module blocks of various types within the connecting module, there will not be enough versatility.

Other terminal block electrical distribution systems are shown and described in the prior U.S. patents to Strate et al U.S. Pat. No. 5,071,356, Frikkee et al U.S. Pat. No. 5,318,461, Horn et al U.S. Pat. No. 5,411,417, and Eggert et al U.S. Pat. No. 5,588,881, which are assigned to the same assignee as that of the present invention.

The present invention is intended to solve this problem in a simple, space-saving manner through design and structure.

SUMMARY OF THE INVENTION

Accordingly, a primary object of the present invention is to provide an improved terminal block for a signal and power electrical distribution system in which an internal bus connecting means is removably connected with the terminal block, said internal bus connection means including a thin support plate that extends parallel with the support rail and carries a plurality of L-shaped connecting pins each having orthogonally arranged portions that extend parallel with and normal to the support plate, respectively. The pin portions that extend normal to the support plate are adapted for connection with the female terminals of a connector strip that is mounted on a printed circuit board that is to be connected with the system. The pin portions that are parallel with the thin plate are adapted for connection with terminals on the terminal block, or with terminals on an adjacent terminal block mounted on common support rail.

The structural separation of the bus conductor sections of each module unit first of all offers the advantage of almost random alignability also of the bus conductor sections and thus increases the variability of the entire module system. Moreover, the selected structural design of the bus conductor section with a thin plate and with angle pins of special length that penetrate the thin plate offers the advantage that one can eliminate separate plug elements for contacting a separate appliance plug or an appliance plug that is molded upon an electronic printed circuit board.

As an alternative, it is also conceivable that the bus conductor sections of the individual base terminal carriers in each case have a thin plate upon which is set at least one row of the angled metal pins, which, with their opposite ends, extend normal to and parallel with the thin plate, respectively, and where, again, the pin row ends that stand normal to the thin plate are so dimensioned that they can be used directly for contacting a socket board. This embodiment is particularly suitable for connection with a surface-mounted device.

Preferably, the signal paths of the bus conductor sections of adjacent modules are so connected in a manner offset with respect to each other that as a function of the number of offset data lines, one can recognize in a simple manner whether several circuit boards provided by a subscriber are or are not present on the base terminal carrier.

BRIEF DESCRIPTION OF THE DRAWINGS

Other objects and advantages of the invention will become apparent from a study of the following specification, when viewed in the light of the accompanying drawings, in which:

FIGS. 3a–3d are left side, front, top, and right front perspective views of the internal connector bus means, respectively;

FIG. 6 is a detailed front perspective view illustrating the manner of connection of the pins of the internal bus connector with the female terminal strip for the printed circuit board, and FIG. 7 illustrates the assembly of FIG. 6 provided with protective cover means and connected with the internal connector bus means of an adjacent second terminal block;

DETAILED DESCRIPTION

Figure 1:
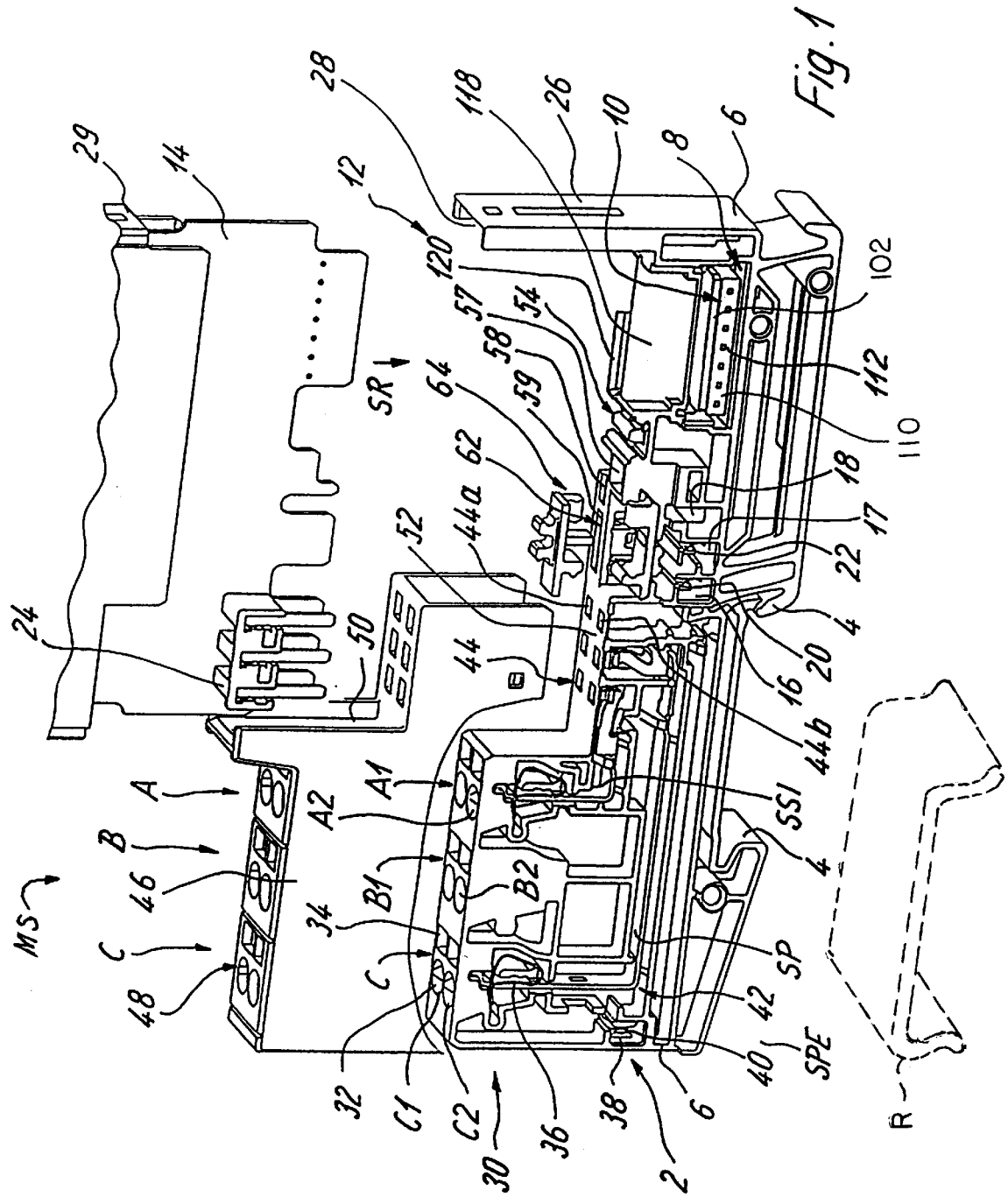
FIG. 1 is an exploded front perspective view of a terminal block assembly including the internal bus connector means of the present invention.

FIG. 1 shows a module disc MS for an appliance used in automation technique otherwise not illustrated here. The appliance has a gateway (not shown here) along which one can line up, among other things, a plurality of module assemblies MS. Module disc MS can be assembled with additional module discs MS to form a terminal block assembly of variable length.

Module disc MS, according to FIG. 1, has a disc-shaped base terminal block 2 to lock the individual module on a support rail R. The base terminal block 2 for this purpose is provided with plastic notch feet 4 with whose help one can establish connection with the support rail in the known manner. Base terminal block 2 comprises a lower base portion 6, which extends into an area above the support rail feet 4 and next to the support rail feet 4 on both sides beyond the rail. In base portion 6, there is provided in the outer area facing away from the rail a recess 8 that penetrates base terminal carrier 2 normal to its main extent plane for receiving the internal bus conductor means 10, which makes it possible to relay the bus conductor signals from individual module to individual module and into the electronic printed circuit board 14.

Module MS can be assembled with additional modules MS to form a terminal block assembly of variable length.

As shown in FIG. 1, the module MS includes, a conventional terminal block 2 that is mounted by support feet 4 on the flanges of the grounded support rail R. As is known in the art, the terminal block is formed of a suitable synthetic plastic material and includes a lower portion 6 that contains a recess 8 for removably receiving the internal bus connector means 10 of the present invention. As will be described in greater detail below, the internal connector carries a plurality of generally L-shaped pins 108 having orthogonally arranged portions for connecting circuits on printed circuit board 14 with the various conductors of the electrical power and signal distribution system.

To receive the electronic printed circuit board 14, a circumferential recess 12 is made in the base terminal carrier 2 in the area that extends roughly from the line that runs normal to the center of the support rail up to the internal bus conductor means 10. Electronic printed circuit board 14 is provided with an electronic circuit (now shown here) for the purpose of processing/relaying the signals that are conducted to the electronic printed circuit board 14.

In the area located between the internal bus conductor section 10 and the notch foot 4, base section 6 is provided with three additional, adjacent openings 16, 17, 18, which penetrate base terminal carrier 2 normal to the main disc or module plane and of which two openings 16, 17 are provided with contact elements 20, 22 that are designed as cross-connectors and that make it possible to relay the associated potentials from module to module. The other opening 18—and others of the openings in the base terminal carrier not described here—serve merely to save material. Cross-connector contacts 20, 22 conduct these potentials into the printed circuit board 4 and/or via a suitable separate plug 24 or a plug that is molded upon the electronic printed circuit board to the connections leading to the bus bars in the base terminal carrier 2 and via them to the connecting planes A, B, C of module unit MS.

Recess 12 is bordered at the end of the individual module that faces away from the carrying rail by a connecting support 26 that extends normal to the base section and that on its side facing toward support rail 4 is provided with an insert groove 28 for inserting the electronic printed circuit board 14 as well as an electronic housing 29.

Adjacent the end of the base terminal carrier 2 that is opposite connecting support 26, there is molded upon base section 6 a connecting section 30 that protrudes orthogonally and upwardly and that is provided with six connections A1, A2, etc., that are arranged in two rows of three each.

Openings 34 with square cross-section next to connection openings 32 for connections A1, A2, B1, B2, etc., make it possible to insert a screwdriver to open the spring contact elements 36 that are arranged in the connecting section 30.

Outside the third connection plane C, there is provided in the base section an additional opening 38 that is normal to the module disc plane and that penetrates the base terminal block 2 and in which lies an additional contact element 40 via which the ground conductor SPE is passed on from individual module to individual module.

The conducting connection between contact springs 36 of connections A, B, C, etc., and of printed circuit board 14 is implemented by means of bus bars (illustrated here: SP for the positive bus bar potential and SSI for the signal; not recognizable: SM for the negative potential). Bus bars SP and SSI extend from contact springs 36 into lateral grooves or recesses 42 of base element 2 in a generally U-shaped fashion on both main outside surfaces of base terminal carrier 2. Below recess 12 for the electronic printed circuit board, the bus bars are angled upward and extend to the circumferential recess 12, which in this area is provided with six connection openings 44 that are arranged in two rows next to each other and that are used for setting appliance plug 24 upon the electronic printed circuit board and/or the printed circuit board edge.

A protective covering housing 46 made of synthetic plastic material can be mounted over connecting section 30; the housing has openings 48 that correspond to the connecting openings 32 and the openings 34. Toward the area of recess 12 of the base terminal carrier 2, the cover is furthermore provided with a lateral groove 50 which, in cooperation with groove 28, receives the electronic printed circuit board 14 and housing 20 that protects the electronic printed circuit board, which housing can be set on the base terminal block 2 in the plug-in direction SR.

Base terminal block 2 or module connector MS has the following functional areas in the area of recess 12 on or under base wall 52 of recess 12 (when viewed from connecting wall 26 toward the inside adjacent rail):

| | |
|---|---|
| Module bus (opening) | BUS/8 |
| Marking slot (for one or two tags) | 54 |
| Lateral notch hook as connection to neighboring terminal with opening 57 to activate notch hook from above | 57 |
| FE contact (functional ground) | 58 |
| Potential guidance contacting opening | 59 |
| Plug socket connection openings | 44 |

Along with the FE contact 58 and openings 44 to potential guides PE+, PE−, there is provided in a particularly space-saving manner a recess 62 for a coding element 64.

Figure 2:
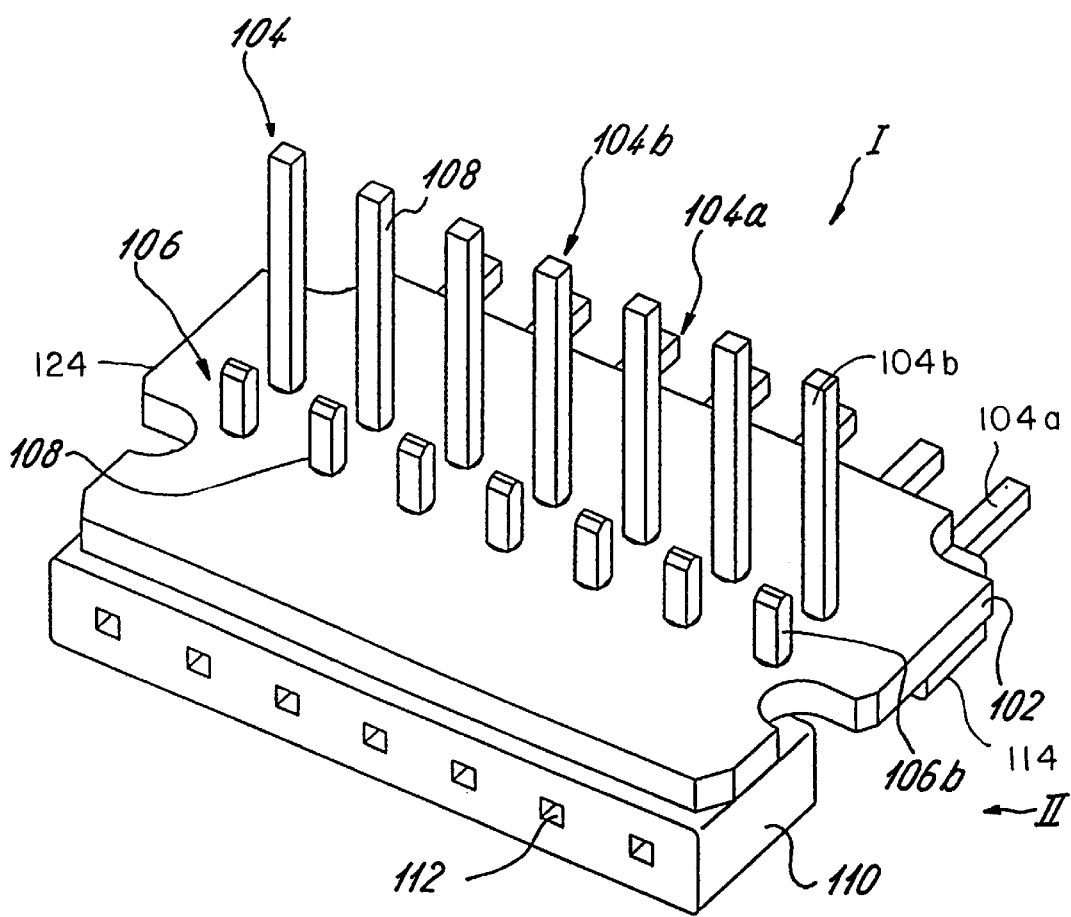
FIG. 2 is a front perspective view of the internal bus connector means of the present invention.

The internal bus conductor section 10, inserted into opening 8 of each base terminal carrier 2 according to FIG. 2, has a thin plate 102 through which passes a first row 104 of metal pins 108 which, on one side of thin plate 102 (side I), include first portions 104b that extend generally normal to thin plate 102 and which, on the opposite side of thin plate 102 (side II), have orthogonally arranged second portions 104a that extend parallel to thin plate 102. A second row 106 of metal pins 108, of course, also just barely penetrates the printed circuit board, but only with short soldering ends 106b. The other ends 106a of this row of pins 106 are contained in the plane of pin row ends 104a. The ends of pin rows 104, 106 are being faced away from each other in the plane. The pin row ends 104a of one row 104 of metal pins 108 protrudes laterally beyond the edge of thin plate 102.

Figure 4:
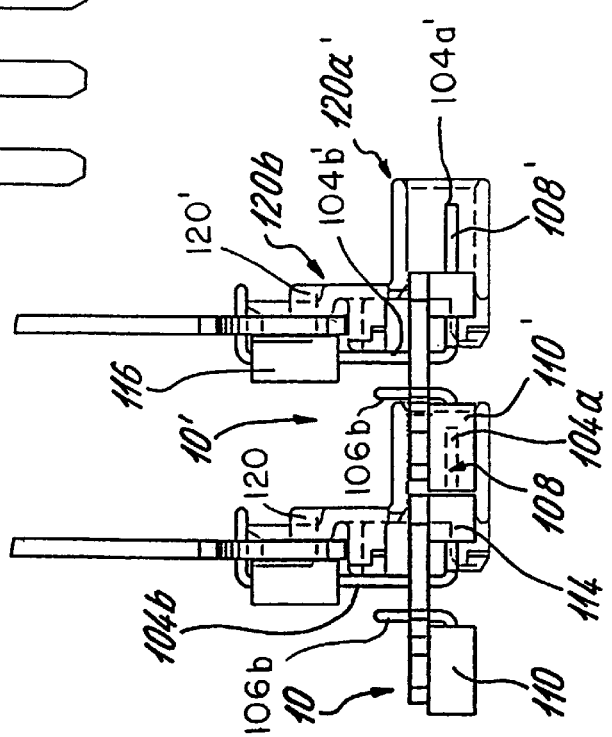
FIG. 4 illustrates a pair of the terminal block assemblies connected with each other and with the associated printed circuit boards, respectively.

As shown in FIGS. 2 and 3, looking at the pin row ends 106a of one of the two rows 106 of metal pins 108 that run parallel to the thin plate, there is set upon said pin row ends 106a a plug socket connector strip 110 that extends over all pin row ends 106a of that row 106 with plug socket openings 112, and a plug pin strip strip 114 is mounted upon the corresponding pin row ends 104a of the other pin row 104. As one can further see in FIG. 4, in case of adjacent or lined-up base terminal carriers, the plug pin row ends 104a of each bus conductor section engage the plug sockets 112 of the second bus conductor section 101 of the particular neighboring base terminal carrier 2.

Figure 5A:
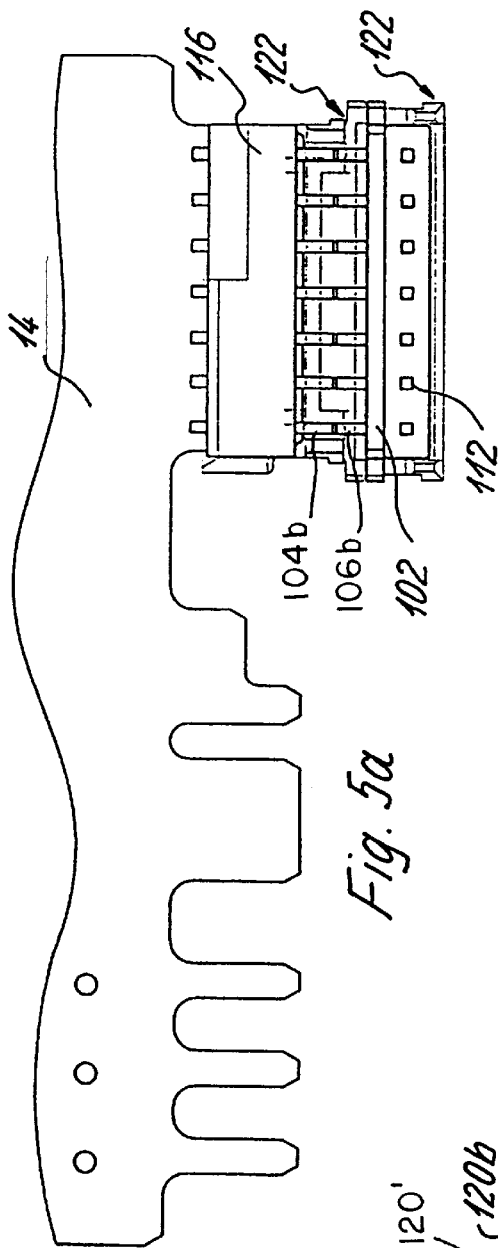
FIGS. 5a and 5b are detailed front elevation and top plan views, respectively, of the internal bus connector means connected with the female terminal strip on a printed circuit board.

One of the pin rows 104, standing normal to the thin plate, is made so long that its pin row ends 104b be used directly for contacting a socket strip 116 (FIG. 5a) that is directly molded upon electronic printed circuit board 14. Therefore, there is no need for making a separate plug element for this purpose on thin plate 102 of bus conductor section 10. Instead, angled pins 108 perform this function.

In conjunction with FIGS. 1 and 7, FIGS. 4 and 5 illustrate the advantageous position of the bus conductor sections 10 in base terminal block 2. Bus conductor sections 10 are inserted in opening 8 where pin row 104 rests against a wall 118 that protrudes perpendicularly upward from base terminal block 2 for the purpose of protecting the pins and the corresponding area of the electronic printed circuit board 14. After bus conductor section 10 has been inserted, one introduces, likewise into opening 8, a molded synthetic plastic cover member 120 that acts as a protective and cover plate where it engages with notch feet 122 in base terminal block 2. The area 120b of the molded synthetic plastic cover member, which is on top in FIG. 4, that is to say, with respect to the electronic printed circuit board, fixes the pin row 104 on wall 118; the lower part 120a is used as a protective cover that protrudes over the edge of terminal carrier 2 for the pin row ends 104a and for the purpose of engaging opening 8 of a neighboring base terminal carrier 2.

Bus conductor sections 10 can be slid laterally into the bus conductor opening 8 of the base terminal block, preferably from the direction of an opening of base terminal block 2; and thin plate 102 is provided with a stop edge 124 FIGS. 3b–3d for the purpose of coming to a halt at a counteredge of the base terminal block 2; this therefore produces the following special advantage: Bus conductor section 10 is securely fixed in base terminal block 2 both during the insertion or extraction of the electronic unit and during the unlocking of the base terminal block 2 from the neighboring base terminal block 2 on the notch hook.

Figure 8:
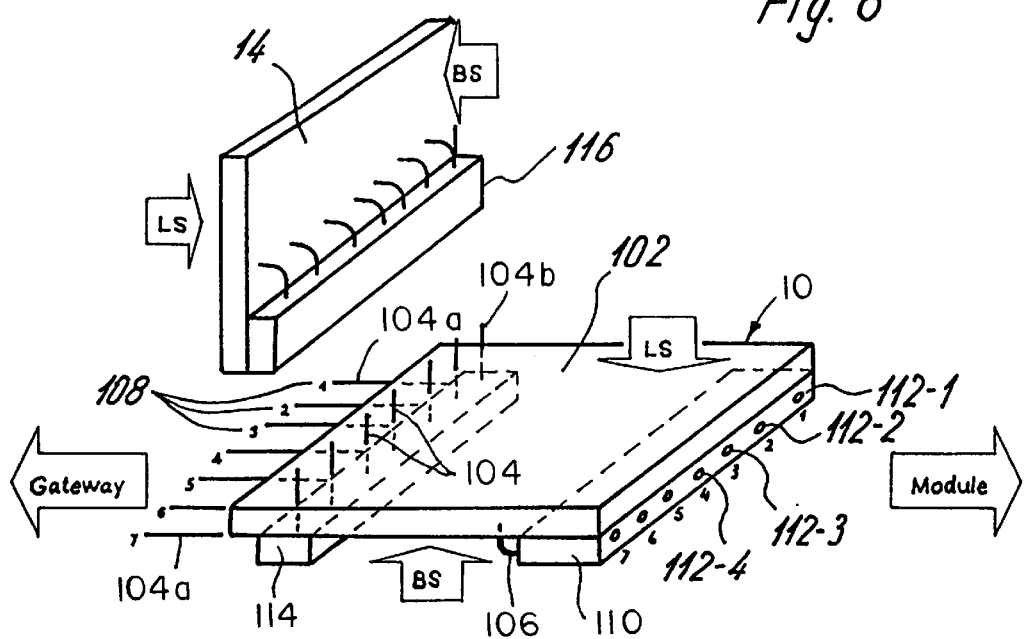
FIG. 8 is a somewhat schematic exploded view of the internal bus connector and the female terminal strip of the associated printed circuit board.

FIG. 8 illustrates the incorporation of the internal bus conductor means 10 into the overlapping module system. An external field bus can be connected at gateway G. Both the power supply to the gateway and to the connecting module or the module discs MS and the relay of the data bus from the gateway to the electronic printed circuit board 14 of the individual base terminal block 2 or the module units MS and the module blocks are provided both in a terminal block structure and in a disc structure by means of the illustrated internal bus conductor means 10. The two plug pin rows 104 and 106 are so connected with each other via thin plate 102 that these connections constitute potential and signal paths from bus conductor section 10 to the electronic printed circuit boards 14 of base terminal block 2.

Figure 5B:
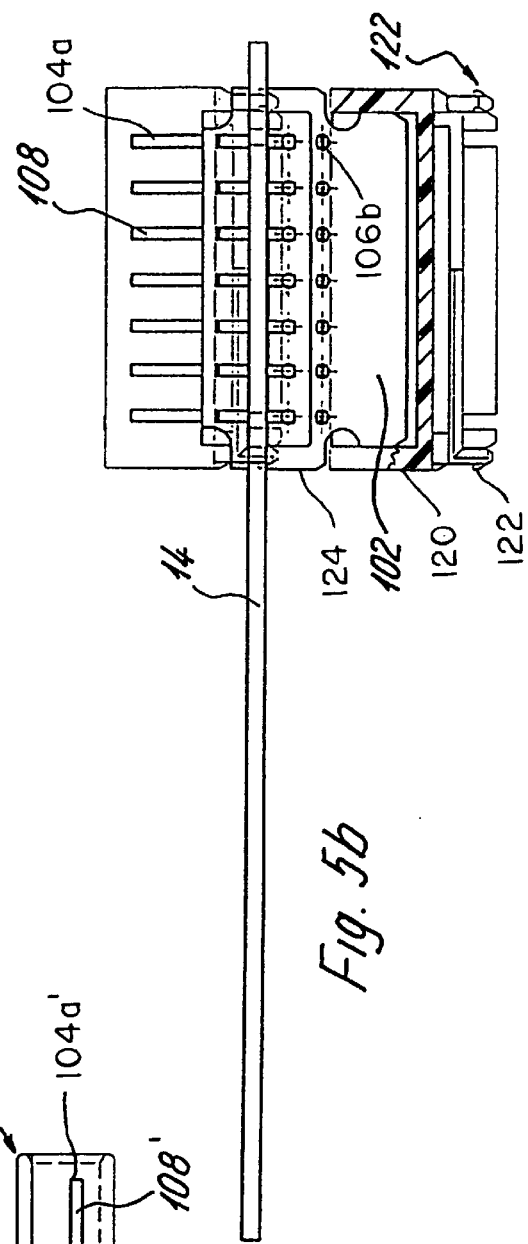
Figures 9A, 9B:
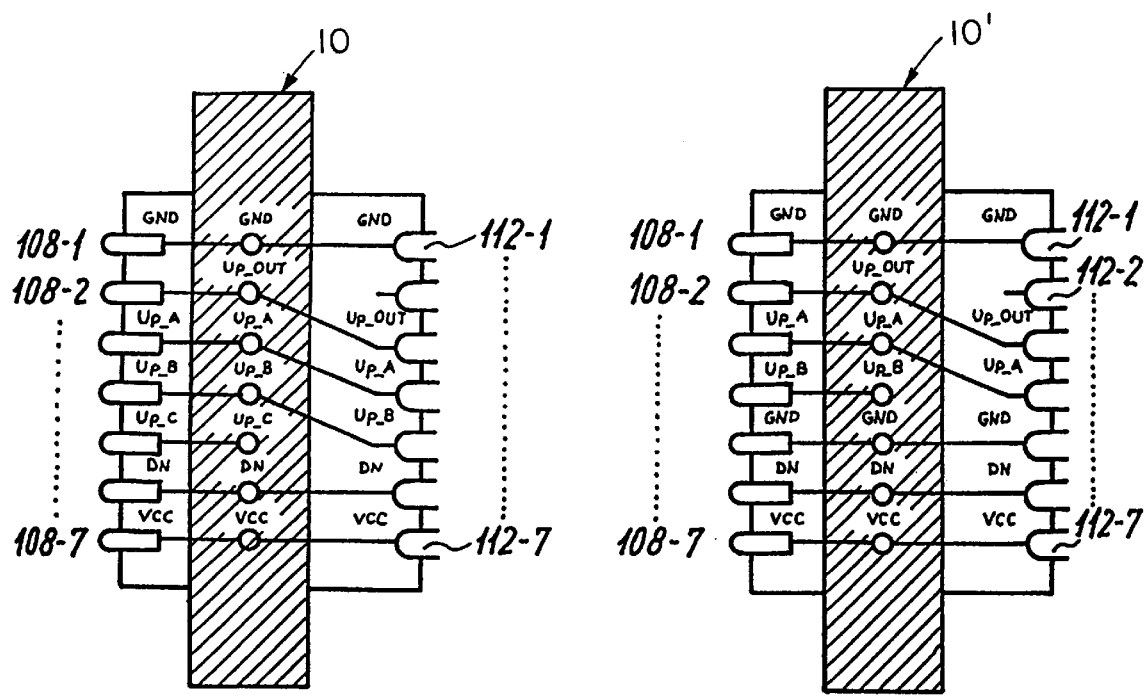
FIGS. 9a and 9b are schematic views illustrating two possible electrical connections between the male and female terminals of the internal bus connector.

Regarding the connection of the data lines from the bus conductor means 10 to bus conductor means 10 according to FIG. 5, the connection between the input side and the output side of each bus conductor means 10 is so accomplished that at least some data lines are connected with each other in an offset fashion according to the manner shown in FIG. 9 supply ring structure or offset lines; return: line structure on continuously lined-up and not-offset-arranged line DN, see plug pin 108-6; socket 112-6, FIG. 9b). According to FIG. 9b, the "input" pin 108-2 is thus connected with the "output" socket 112-3, pin 108-3 is connected to output socket 112-4, and pin 108-4 is connected to electronic printed circuit board 14 ("subscriber"). In this way, the signal paths of the bus conductor sections of neighboring modules are so connected with each other that as a function of the number of offset data lines in the supply direction, one can recognize whether an electronic printed circuit board 14 was taken off the base terminal block 2 before the subscriber.

If the data line is further offset in the direction according to FIG. 9a, then one can recognize in each case two removed electronic printed circuit boards or two subscribers (N-1 or N-2 or N-1 and N-2 together) even before the mounting electronic printed circuit board 14 of subscriber (N). The variants in FIGS. 9a and 9b cannot be combined with each other.

The input pins 108-1 through 108-7 of the internal connection means 10 are connected with the circuits of printed circuit board and with the female socket terminals 112-1 through 112-7 by selected connections between the vertical pin portions 104b and 106b. For example, in FIG. 9a, pin 108-2 is connected with female terminal 112-3, and pins 108-3 and 108-4 are connected with female terminals 112-4 and 112-5, respectively. Ground pin 108-1 and pins 108-6 and 108-7 are directly connected with the opposite female terminals 112-1, 112-6, and 1 12-7, respectively. In this way, the signal paths of the internal bus connections of adjacent modules are so connected that in accordance with the number of offset data lines in the supply direction, one can determine if a printed circuit board 14 has been removed from the associated terminal block 2. If the data line is further offset in the direction of FIG. 9a, one can determine the removal of two circuit boards (i.e., N-1, or N-2, or N-1 and N-2) even before the mounting of a given circuit board 14 of a given subscriber (N).

While in accordance with the provisions of the Patent Statutes the preferred forms and embodiments of the invention have been illustrated and described, it will be apparent that changes and modifications may be made without deviating from the inventive concepts set forth above.

What is claimed is:

1. A terminal block assembly for use in connection with an electrical power and signal distribution system including a horizontal support rail (R), comprising:

(a) a generally rectangular vertically arranged terminal block (2) formed of synthetic plastic insulating material, said terminal block having a longitudinal lower edge portion containing foot means (4) for mounting said terminal block transversely above the support rail;

(b) generally rectangular horizontal unitary thin support plate (102) having first and second longitudinally extending side edges parallel with said terminal block, and a pair of end edges;

(c) a first row of first L-shaped pins (104) having vertical portions (104b) that extend respectively upwardly through a first row of corresponding first openings contained in said support plate, said first openings being arranged in a row parallel with said first longitudinal side edge, said first pins having parallel horizontal lower portions (104a) that extend toward said first longitudinal side edge;

(d) a second row of second L-shaped pins (106) having vertical portions (106b) that extend upwardly through a second row of corresponding second openings contained in said plate between said first row and a second one of said longitudinal edges, said second pins including parallel horizontal lower portions (106a) that extend toward said second longitudinal side edge;

(e) first (114) and second (110) connector strips each containing openings, said opening receiving said horizontal lower portions of said first and second pins, respectively, said first and second connector strips being arranged adjacent said first and second longitudinal side edges of said plate, respectively, thereby to define an internal bus bar connector (10); and (f) means for mounting said bus bar connector within a corresponding opening (8) contained in said terminal block.

2. The terminal block assembly as defined in claim 1, wherein said first and second connector strips are female connector strips; and further wherein said lower portions of said first pins extend through said first connector strips outwardly beyond said thin plate first longitudinal edge, thereby to afford connection with the second connector strip of an adjacent second terminal block mounted on the rail.

3. The terminal block assembly as defined in claim 1, and further including a vertical rectangular electrical component (14) having a lower longitudinal edge, and a female third strip connector (116) mounted on said lower edge for connection with said first pin upper portions (104b) when said electrical component is mounted in an opening in said terminal block above said thin plate.

4. The terminal block assembly as defined in claim 3, and further including means offsetting the connections between said lower ends of said first pins (108-1 through 108-7) and the corresponding female contacts (112-1 through 112-7) of said second connector strip.

5. The terminal block assembly as defined in claim 1, wherein said bus bar connector is removably mounted in said opening.

6. The terminal block assembly as defined in claim 5, wherein the end edges (24) of said thin plate define stop edges that cooperate with corresponding stop edges of said opening, respectively.

* * * * *